US008824622B2

(12) United States Patent
Tsuge et al.

(10) Patent No.: US 8,824,622 B2
(45) Date of Patent: Sep. 2, 2014

(54) BUFFER CIRCUIT AND BUFFER CIRCUIT DRIVING METHOD

(71) Applicant: Panasonic Corporation, Osaka (JP)

(72) Inventors: Hitoshi Tsuge, Osaka (JP); Masafumi Matsui, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/735,354

(22) Filed: Jan. 7, 2013

(65) Prior Publication Data

US 2013/0266113 A1 Oct. 10, 2013

Related U.S. Application Data

(60) Provisional application No. PCT/JP2012/002487, filed on Apr. 10, 2012.

(51) Int. Cl.
*G11C 19/00* (2006.01)
*H03K 3/00* (2006.01)
*G11C 19/18* (2006.01)
*G11C 19/28* (2006.01)

(52) U.S. Cl.
CPC ............... *H03K 3/00* (2013.01); *G11C 19/184* (2013.01); *G11C 19/28* (2013.01)
USPC ................. 377/64; 377/68; 377/78; 377/79

(58) Field of Classification Search
None
See application file for complete search history.

(56) References Cited

U.S. PATENT DOCUMENTS

| | | | | |
|---|---|---|---|---|
| 5,949,398 | A * | 9/1999 | Kim | 345/100 |
| 7,848,477 | B2 * | 12/2010 | Cheng et al. | 377/64 |
| 8,045,675 | B2 * | 10/2011 | Chan et al. | 377/64 |
| 2007/0274433 | A1 * | 11/2007 | Tobita | 377/64 |
| 2010/0141642 | A1 | 6/2010 | Furuta et al. | |
| 2011/0091006 | A1 * | 4/2011 | Liu et al. | 377/68 |
| 2012/0194489 | A1 * | 8/2012 | Iwamoto et al. | 345/204 |
| 2012/0207266 | A1 * | 8/2012 | Tobita et al. | 377/64 |
| 2012/0326955 | A1 * | 12/2012 | Ohara | 345/92 |
| 2013/0070891 | A1 * | 3/2013 | Tsai et al. | 377/64 |

FOREIGN PATENT DOCUMENTS

| | | |
|---|---|---|
| JP | 58-029200 | 2/1983 |
| JP | 2001-101889 | 4/2001 |
| JP | 2010-061800 | 3/2010 |
| WO | 2009/034750 | 3/2009 |

OTHER PUBLICATIONS

International Search Report and Written Opinion for PCT/JP2012/002487, dated Jun. 19, 2012.

* cited by examiner

*Primary Examiner* — Tuan T Lam
(74) *Attorney, Agent, or Firm* — Greenblum & Bernstein, P.L.C.

(57) ABSTRACT

A buffer circuit driving method for driving a buffer circuit including: an output terminal; a first transistor connected to a signal source of a clock signal that is of at least a first voltage or a second voltage lower than the first voltage, for supplying the first voltage to the output terminal; and a second transistor connected to a voltage source that supplies a third voltage lower than the first voltage, for supplying the third voltage to the output terminal, includes: causing the first transistor to switch to a conducting state in a period where the clock signal is of the first voltage; and causing the first transistor and the second transistor to switch to the conducting state in a period where the clock signal is of the second voltage, following the period where the clock signal is of the first voltage.

12 Claims, 18 Drawing Sheets

BUFFER CIRCUIT AND BUFFER CIRCUIT DRIVING METHOD

CROSS REFERENCE TO RELATED APPLICATION

This is a continuation application of PCT Patent Application No. PCT/JP2012/002487 filed on Apr. 10, 2012, designating the United States of America. The entire disclosure of the above-identified application, including the specification, drawings and claims are incorporated herein by reference in its entirety.

FIELD

One or more exemplary embodiments disclosed herein relate generally to buffer circuits and driving methods thereof, and relate particularly to a buffer circuit capable of shortening fall time of a buffer circuit output signal and to a driving method thereof.

BACKGROUND

Recent years have seen active development of active-matrix display devices using a liquid crystal panel or an electroluminescence element (hereafter referred to as an organic EL element). In particular, as image display devices using current-driven light-emitting elements, organic EL displays using organic EL elements have the advantage of excellent viewing angle characteristics and low power consumption, and are thus attracting attention as candidates for next-generation flat-panel displays (FPDs).

In the aforementioned active-matrix display device, images are displayed by selecting two-dimensionally arranged pixel circuits on a row basis, and writing a voltage corresponding to display data into the selected pixel circuits via a signal line. In order to select pixel circuits on a row basis, a shift register is used which sequentially shifts the output signal outputted to a scanning line, based on a clock signal from a scanning line driving circuit.

Furthermore, a shift register such as that described above uses a buffer circuit in which transistors are connected in series via an output terminal (see Patent Literature (PTL) 1, for example).

CITATION LIST

Patent Literature

[PTL 1] International Publication No. 2009/034750

SUMMARY

Technical Problem

Such a buffer circuit has the problems of shortening output signal fall time, and realizing circuit area reduction and power consumption reduction.

In view of this, one non-limiting and exemplary embodiment provides a buffer circuit which shortens output signal fall time, and allows circuit area reduction and power consumption reduction, and a method of driving the buffer circuit.

Solution to Problem

In one general aspect, the techniques disclosed here feature a buffer circuit driving method for driving a buffer circuit including: an output terminal; a first transistor connected to a signal source of a clock signal that is of at least a first voltage or a second voltage lower than the first voltage, for supplying the first voltage to the output terminal; and a second transistor connected to a voltage source that supplies a third voltage lower than the first voltage, for supplying the third voltage to the output terminal, the buffer circuit driving method including: causing the first transistor to switch to a conducting state in a period in which the clock signal is of the first voltage; and causing both the first transistor and the second transistor to switch to the conducting state in a period in which the clock signal is of the second voltage, following the period in which the clock signal is of the first voltage.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

A buffer circuit according to one or more exemplary embodiments or features disclosed herein is capable of shortening output signal fall time, and which allows circuit area reduction and power consumption reduction, and a method of driving the buffer circuit.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS (Underlying Knowledge forming the Basis of the Present Invention)

As described in the Background Art, with the buffer circuit used in a shift register circuit, there is the challenge of shortening output signal fall time, and realizing circuit area reduction and power consumption reduction.

Figure 1:
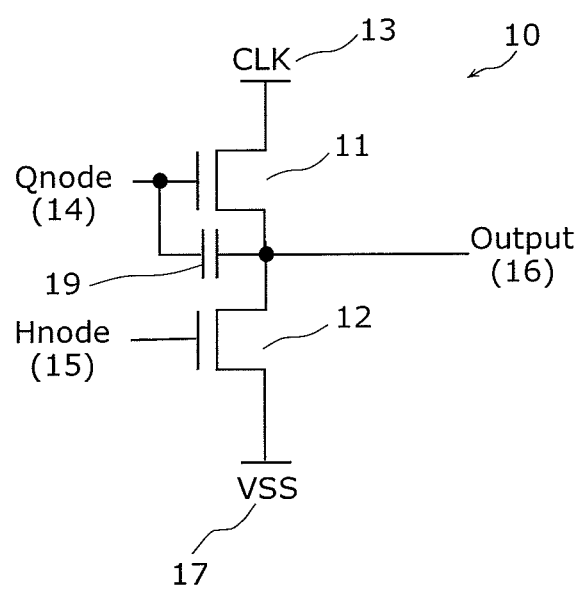
FIG. 1 is circuit diagram showing an example of a buffer circuit.

FIG. 1 is circuit diagram showing an example of a buffer circuit.

FIG. 1 shows, as an example, a buffer circuit configured using two NMOS transistors connected in series via an output terminal.

A buffer circuit 10 includes: an output terminal 16; a transistor 11 and a transistor 12 which are connected in series via the output terminal 16; and capacitor element 19.

The transistor 11 and the transistor 12 are NMOS transistors.

The drain of the transistor 11 is connected to a clock signal source 13, and the source of the transistor 11 is connected to the output terminal 16 and the source of the transistor 12. The gate of the transistor 11 is an input terminal 14 (Qnode) of the buffer circuit.

The drain of the transistor 12 is connected to a low-voltage source VSS, and the source of the transistor 12 is connected to the output terminal 16 and the source of the transistor 11. The gate of the transistor 12 is an input terminal 15 (Hnode) of the buffer circuit.

The clock signal source 13 outputs a clock signal which assumes two values, VDD and VSS.

The capacitor element 19 is a capacitor element used in bootstrapping to be described later.

The operation of the buffer circuit 10 shown in FIG. 1 is described below using FIG. 2 and FIG. 3.

Figure 2:
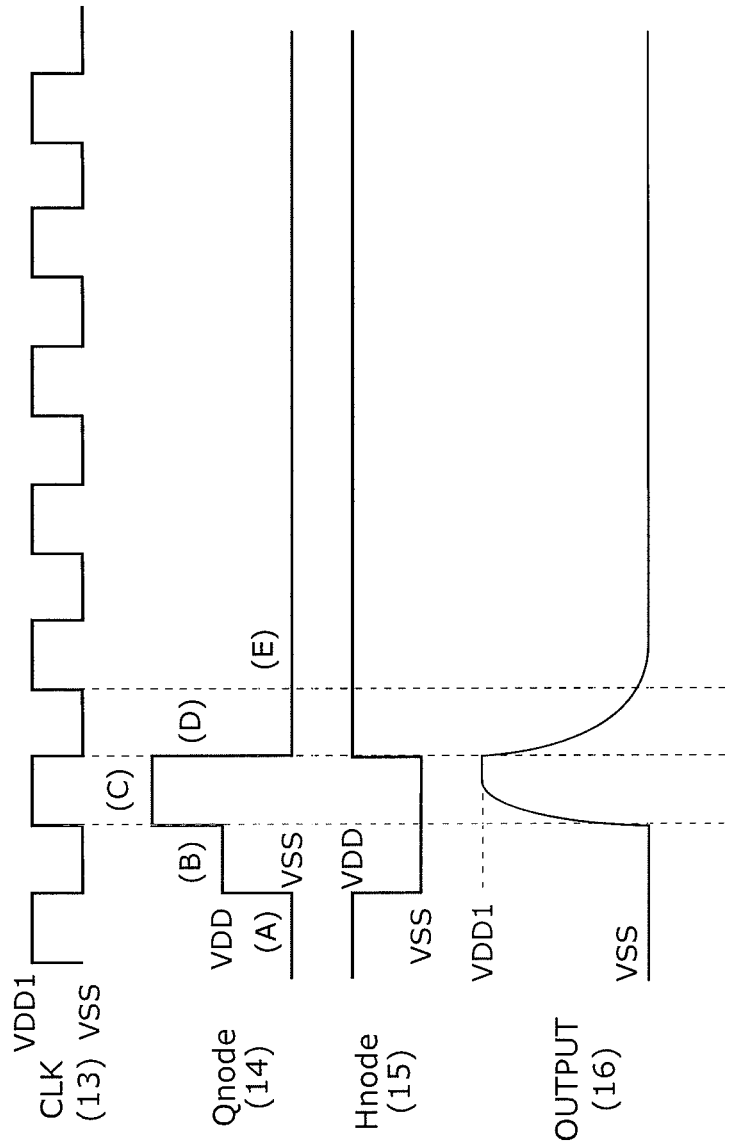
FIG. 2 is a timing chart of a signal for the buffer circuit.

FIG. 2 is a timing chart of a signal for the buffer circuit 10 in FIG. 1.

Figure 3:
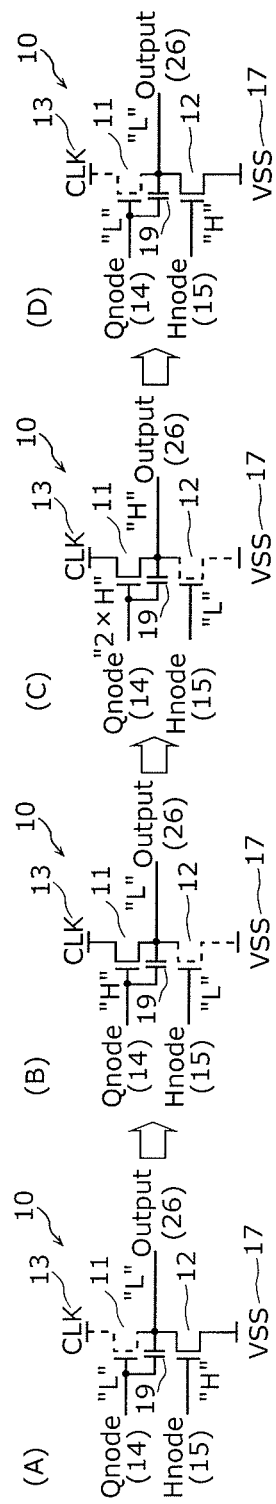
FIG. 3 is a diagram showing the operation of the buffer circuit in FIG. 1.

FIG. 3 is a diagram showing the operation of the buffer circuit 10 in FIG. 1.

In the state shown in (A) in FIG. 2 and (A) in FIG. 3, a low-level voltage is applied to the input terminal 14 and the transistor 11 is in a non-conducting state. On the other hand, since a high-level voltage is applied to the input terminal 15 and the transistor 12 is in a conducting state, VSS of the low-voltage source 17 is outputted to the output terminal. Specifically, the output terminal 16 of the buffer circuit is in the low-level state.

When changing the output terminal 16 to the high-level state from such state, first the high-level voltage is applied to the input terminal 14 to switch the transistor 11 to the conducting state, as shown in (B) in FIG. 2 and (B) in FIG. 3. At the same time, the low-level voltage is applied to the input terminal 15 to switch the transistor 12 to the non-conducting state. With this, the capacitor element 19 is charged with the high-level voltage applied to the input terminal 14. It should be noted that, although in this state the output terminal 16 and the clock signal source 13 are in the conducting state, because the voltage value of the clock signal source 13 is VSS, the voltage VSS is outputted to the output terminal 16, and thus the output terminal 16 is in the low-level state.

Next, as shown in (C) in FIG. 2 and (C) in FIG. 3, in period (C), the voltage applied to the input terminal 15 is maintained and after the input terminal 14 is controlled to a floating state, the voltage of the clock signal source 13 rises from the low level to the high level.

Then, as shown in (C) in FIG. 2, in accordance with the rise of the clock signal source 13, the voltage of the input terminal 14 rises from the voltage held in the capacitor element 19 by as much as the high-level voltage (VDD1) of the clock signal source 13. At this time, since the gate-source voltage of the transistor 11 is kept at the ON-voltage, VDD1 of the clock signal source 13 is outputted to the output terminal 16.

An operation such as that shown in (B) and (C) in FIG. 2 and (B) and (C) in FIG. 3 is called bootstrapping (bootstrap circuit), and this allows the rise time of the output signal to be shortened.

On the other hand, when making the output terminal 16 fall from the high level to the low level, the voltage of the output signal is made to drop by applying the low-level voltage to the input terminal 14 to switch the transistor 11 to the non-conducting state, and applying the high-level voltage to the input terminal 15 to switch the transistor 12 to the conducting state, as shown in the subsequent (D) in FIG. 2 and (D) in FIG. 3.

At this time, in order to shorten the fall time, it is necessary to increase the driving performance of the transistor 12 for causing the voltage of the output signal to drop in the period (D) in FIG. 2.

When the driving performance of transistor 12 is to be increased, the required area for forming the transistor 12 increases. Furthermore, with the increase in the driving performance of the transistor 12, there is the problem that the leak current of the transistor 12 increases in the period (C) in FIG. 12, and thus power consumption increases. In particular, when the threshold voltage of the transistor 12 has depression characteristics due to the forming condition of the transistor 12, power consumption further increases because the aforementioned leak current increases.

In other words, there is a tradeoff relationship between the shortening of the fall time of the buffer circuit 10 and the reduction of circuit area and power consumption, and achieving both is very difficult.

Therefore, there is a demand for the buffer circuit 10 which shortens output signal fall time and has minimal power consumption and circuit area.

In view of this, a buffer circuit driving method according to an exemplary embodiment disclosed herein is characterized in being a buffer circuit driving method for driving a buffer circuit including: an output terminal; a first transistor connected to a signal source of a clock signal that is of at least a first voltage or a second voltage lower than the first voltage, for supplying the first voltage to the output terminal; and a second transistor connected to a voltage source that supplies a third voltage lower than the first voltage, for supplying the third voltage to the output terminal, the buffer circuit driving method including: causing the first transistor to switch to a conducting state in a period in which the clock signal is of the first voltage; and causing both the first transistor and the second transistor to switch to the conducting state in a period in which the clock signal is of the second voltage, following the period in which the clock signal is of the first voltage.

Accordingly, since the voltage of the output signal can be made to drop using both the first transistor and the second transistor, fall time can be shortened without increasing the circuit area and power consumption of the second transistor.

Furthermore, the second voltage may be set as a voltage lower than the third voltage.

Accordingly, since the voltage of the output signal can be made to drop more vigorously using the first transistor, the fall time can be further shortened.

Furthermore, a buffer circuit according to an exemplary embodiment disclosed herein is characterized in being a buffer circuit including: an output terminal; a first transistor connected to a signal source of a clock signal that is of at least a first voltage or a second voltage lower than a first voltage, for supplying the first voltage to the output terminal; and a second transistor which is connected to a voltage source that supplies a third voltage lower than the first voltage, for supplying the third voltage to the output terminal, wherein the first transistor is caused to switch to a conducting state in a period in which the clock signal is of the first voltage, and both the first transistor and the second transistor are caused to switch to the conducting state in a period in which the clock signal is of the second voltage, following the period in which the clock signal is of the first voltage.

Accordingly, since the voltage of the output signal can be made to drop using both the first transistor and the second transistor, fall time can be shortened without increasing the circuit area and power consumption of the second transistor.

Furthermore, the second voltage may be set as a voltage lower than the third voltage.

Accordingly, since the voltage of the output signal can be made to drop more vigorously using the first transistor, the fall time can be further shortened.

Furthermore, the first transistor may have a gate connected to the output terminal via a capacitor element.

Specifically, the buffer circuit and the buffer circuit driving method according to one or more exemplary embodiments disclosed herein can also be applied to a buffer circuit including a bootstrap circuit.

Furthermore, a shift register according to an exemplary embodiment disclosed herein is a shift register including unit circuits connected in multiple stages and each including a logic circuit and an output unit including any one of the above-described buffer circuits, wherein the logic circuit includes: a first signal generation unit configured to generate, according to a signal inputted from one of the unit circuits which is in an immediately preceding stage, a first signal for switching the first transistor between the conducting state and a non-conducting state; and a second signal generation unit configured to generate a second signal for switching the second transistor between the conducting state and the non-conducting state.

Specifically, the buffer circuit and the buffer circuit driving method according to one or more exemplary embodiments disclosed herein can also be applied to a shift register.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments shall be described with reference to the Drawings.

It should be noted that each of the exemplary embodiments described below shows a general or specific example. The numerical values, shapes, materials, structural elements, the arrangement and connection of the structural elements, steps, the processing order of the steps, etc. shown in the following exemplary embodiments are mere examples, and therefore do not limit the scope of the appended claims and their equivalents. Furthermore, among the structural elements in the following exemplary embodiments, structural elements not recited in any one of the independent claims are described as arbitrary structural elements.

Embodiment 1

Figure 4:
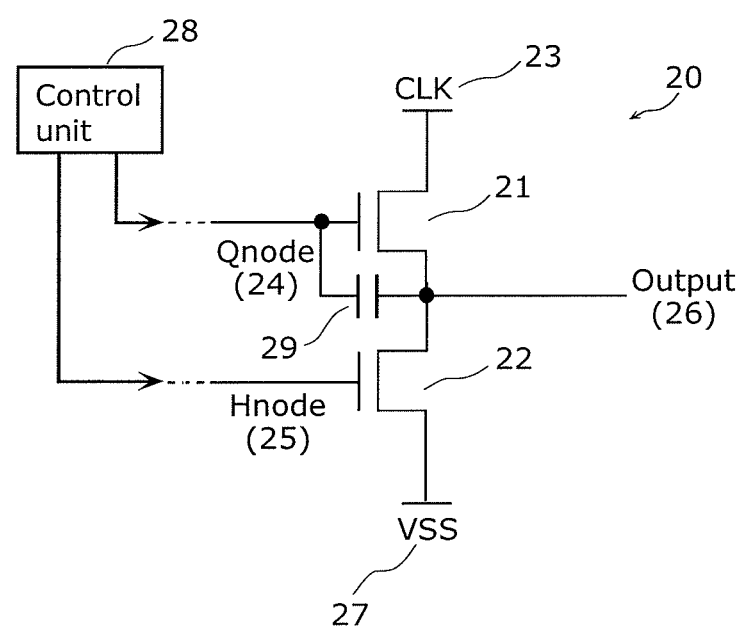
FIG. 4 is a circuit diagram showing a buffer circuit according to Embodiment 1.

FIG. 4 is a circuit diagram showing a buffer circuit according to Embodiment 1.

FIG. 4 shows, as an example, a buffer circuit configured using two NMOS transistors connected in series via an output terminal.

A buffer circuit 20 includes: an output terminal 26; a first transistor 21 and a second transistor 22 which are connected in series via the output terminal 26; a control unit 28; and capacitor element 29.

The first transistor 21 and the second transistor 22 are NMOS transistors (switching transistors).

The drain of the first transistor 21 is connected to a clock signal source 23, and the source of the first transistor 21 is connected to the output terminal 26 and the source of the second transistor 22. The gate of the first transistor 21 is an input terminal 24 (Qnode) of the buffer circuit.

The drain of the second transistor 22 is connected to a low-voltage source 27 (VSS (third voltage)), and the source of the second transistor 22 is connected to the output terminal 26 and the source of the first transistor 21. The gate of the second transistor 22 is an input terminal 25 (Hnode) of the buffer circuit.

The control unit 28 applies, to the input terminal 24, a high-level or low-level voltage for switching the first transistor 21 between the conducting and non-conducting states. In the same manner, the control unit 28 applies, to the input terminal 25, a high-level or low-level voltage for switching the second transistor 22 between the conducting and non-conducting states Specifically, the first transistor 21 and the second transistor 22 are switching transistors.

The clock signal source 23 outputs a clock signal which assumes the two values VDD1 (first voltage) and VSS (second voltage). The clock signal source 23 supplies VDD1 or VSS to the output terminal 26, through the switching of the first transistor 21 to the conducting state.

The low-voltage source 27 supplies VSS to the output terminal 26, through the switching of the second transistor 22 to the conducting state.

The capacitor element 29 is a capacitor element used in bootstrapping to be described later. It should be noted that, when the first transistor 21 is large and the gate-source parasitic capacitance is large, the parasitic capacitance may be used as the capacitor element 29.

The operation of the buffer circuit shown in FIG. 4 as described above, shall be described using FIG. 5, FIG. 6, and FIG. 7.

Figure 5:
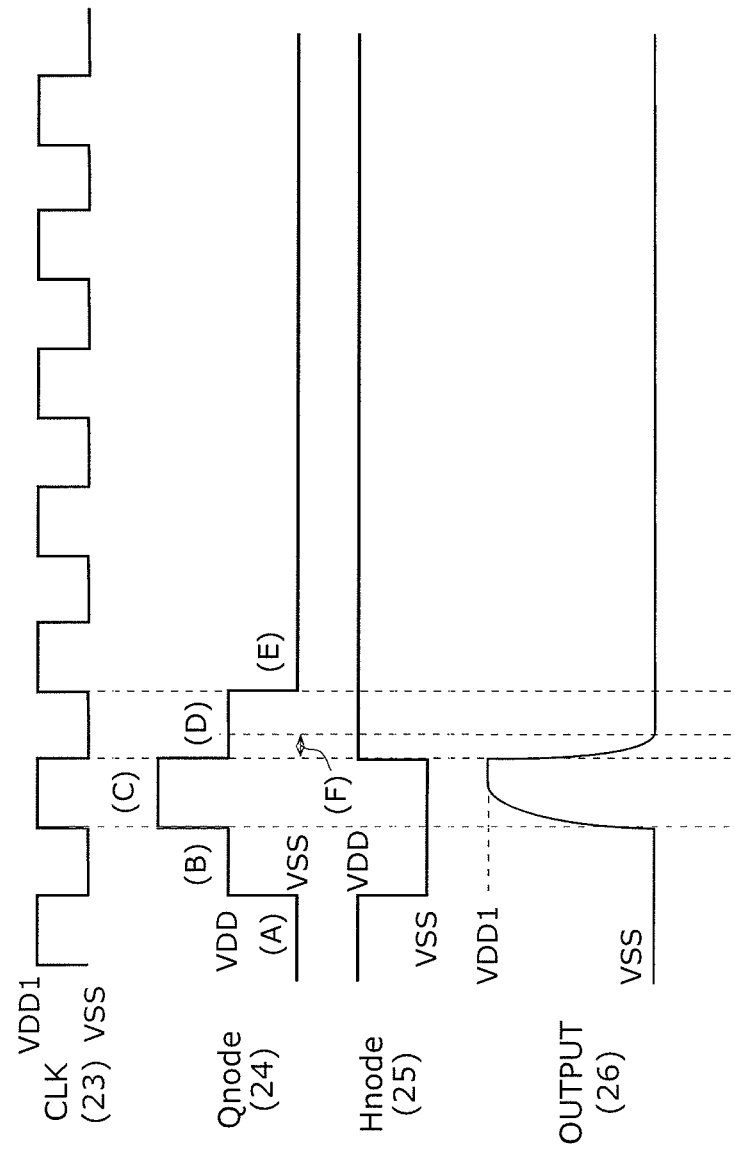
FIG. 5 is timing chart of a signal for the buffer circuit according to Embodiment 1.

FIG. 5 is a timing chart of a signal for the buffer circuit 20 in FIG. 4.

Figure 6:
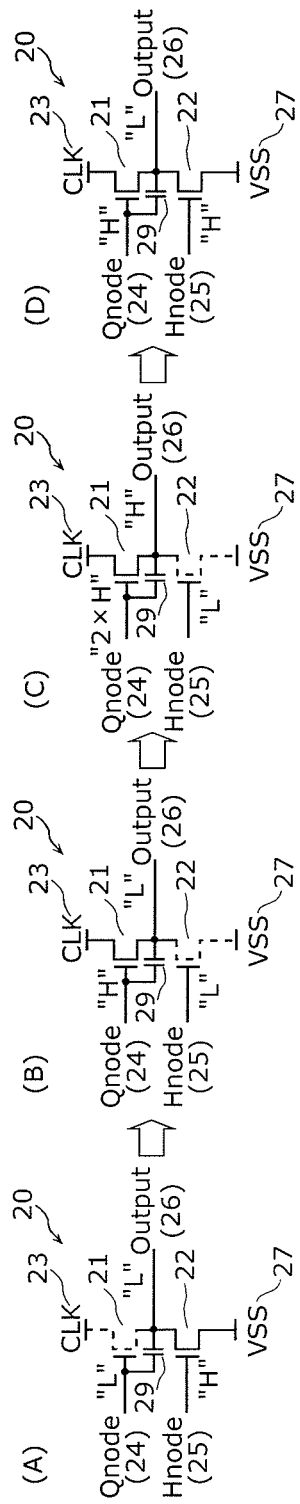
FIG. 6 is a diagram showing the operation of the buffer circuit according to Embodiment 1.

FIG. 6 is a diagram showing the operation of the buffer circuit 20 in FIG. 4.

Figure 7:
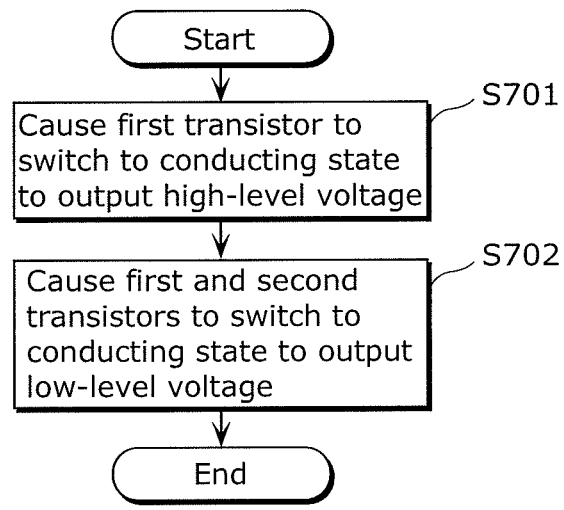
FIG. 7 is a flowchart showing the operation of the buffer circuit according to Embodiment 1.

FIG. 7 is a flowchart for the operation of the buffer circuit 20 in FIG. 4.

A characteristic feature of the buffer circuit 20 according to Embodiment 1 is that both the first transistor 21 and the second transistor 22 included in the buffer circuit switch to the conducting state in period (D).

First, as shown in (A) in FIG. 5 and (A) in FIG. 6, in period (A), the control unit 28 causes the first transistor 21 to switch to the non-conducting state by applying the low-level voltage (VSS) to the input terminal 24. On the other hand, the control unit 28 applies ON voltage between the gate and source of the second transistor 22 by applying the high-level voltage (VDD) to the input terminal 25. With this, the control unit 28 causes the second transistor 22 to switch to the conducting state. Specifically, the output terminal 26 and the low-voltage source 27 are changed to the conducting state, and VSS of the low-voltage source 27 is outputted to the output terminal 26. Specifically, in the period (A), the output terminal 26 of the buffer circuit 20 is in the low-level state.

When changing the output terminal 26 to the high-level state from such state, period (B) is first provided as preparation for changing the output to the high-level voltage, as shown in (B) in FIG. 5 and (B) in FIG. 6.

In the period (B), the control unit 28 applies the ON voltage between the gate and source of the first transistor 21 by applying the high-level voltage to the input terminal 24. With this, the control unit 28 causes the first transistor 21 to switch to the conducting state. At the same time, the control unit 28 causes the second transistor 22 to switch to the non-conducting state by applying the low-level voltage to the input terminal 25.

With this, the capacitor element 29 is charged with the high-level voltage applied to the input terminal 24.

The capacitor element 29 holds the voltage applied between the gate and source of the first transistor 21, until the low-level voltage is applied next to the input terminal 24.

It should be noted that, although in the period (B) the output terminal 26 and the clock signal source 23 are in the conducting state, because the voltage of the clock signal source 23 is VSS, the voltage VSS is outputted to the output terminal 26, and thus the output terminal 26 is in the low-level state.

It should be noted that, although in the period (B) the output terminal 26 is changed to the low-level state by applying the high-level voltage to the input terminal 24 and applying VSS from the clock signal source, there is no problem with the operation even when the input terminal 25 is in the high-level state because the voltage applied from the low-voltage source 27 is VSS. Therefore, in the period (B), the input terminal 25 may be in an arbitrary state.

However, as described later, in the subsequent period (C), the input terminal 25 must be in the low-level state. Therefore, in order to be sure that the input terminal 25 changes to the low-level state in the period (C) even when rounding occurs in the waveform of the voltage applied by the control unit 28 to the input terminal 25, it is preferable that a low-level voltage is applied before hand to the input terminal 25 in the period (B).

Next, as shown in (C) in FIG. 5 and (C) in FIG. 6, in period (C), the control unit 28 applies the high-level voltage to the input terminal 25 to change the input terminal 24 to a floating state. Furthermore, in the period (C), the clock signal source 23 (the clock signal) rises from the low level to the high level.

Then, as shown in (C) in FIG. 6, in accordance with the rise of the clock signal source 23, the voltage of the input terminal 24 rises further from the voltage held in the capacitor element 29 by as much as the high-level voltage of the clock signal source 23. For example, assuming that the wire corresponding to the input terminal 24 is in an ideal state in which there is no parasitic capacitance, the voltage at the input terminal 24, assuming VSS to be 0 V, becomes VDD (the voltage with which the capacitor element 29 is charged in the period (B))+VDD1 (the high-level voltage of the clock signal source 23). Furthermore, at this time, since the gate-source voltage of the first transistor 21 is kept at the ON-voltage, the high-level voltage of the clock signal source 23 is outputted to the output terminal 26.

As described above, according to the operation in the periods (B) and (C), the rise time of the signal (output signal) to be outputted to the output terminal can be shortened. The operation in periods (B) and (C) correspond to step S701 in FIG. 7.

It should be noted that the rise time of the output signal is determined by the time constant of a load connected to the output terminal 26 and by the ON-resistance of the first transistor 21.

Next, as shown in (D) in FIG. 5 and (D) in FIG. 6, in period (D), the control unit 28 applies the high-level voltage to the input terminal 25. With this, the control unit 28 causes the second transistor 22 to switch to the conducting state, to apply the VSS of the low-voltage source 27 as the low-level voltage to the output terminal 26. Furthermore, the control unit 28 applies the high-level voltage to the input terminal 24.

Specifically, the control unit 28 performs control to cause both the first transistor 21 and the second transistor 22 to switch to the conducting state in the period in which the clock signal is of the second voltage, following the period in which the clock signal is of the first voltage.

Accordingly, compared to the conventional configuration, there are the two paths of the first transistor 21 and the second transistor 22 for the path for causing the voltage of the output terminal 26 to drop to the low level voltage, and thus the output terminal 26 can be changed to the low level state more rapidly than with the conventional single path. In other words, the fall time can be shortened.

Therefore, when a fall time that is the same as the fall time shown by the input waveform in FIG. 2 is to be realized, employing the buffer circuit 20 according to Embodiment 1 allows the channel size of the second transistor 22 to be reduced by as much as the channel size of the first transistor 21.

For example, when the channel size of the transistor 11 is channel width/channel length=500 μm/12 μm, and the channel size of the transistor 12 is channel width/channel length=1000 μm/12 μm, in the buffer circuit 20 according to Embodiment 1, the channel size of the second transistor 22 need only be 500 μm/12 μm. In other words, the channel size of the transistor can be halved.

Furthermore, with the reduction in the channel size of the second transistor 22, aside from a reduction in circuit area, the flow-through current from the clock signal source 23 to the low-voltage source 27 (VSS) caused by the leak current of the second transistor 22 occurring in the period (C) is reduced. Specifically, it is possible to suppress an increase in power consumption due to a leak current which is unrelated to the normal driving of the buffer circuit.

As described above, with the buffer circuit 20 according to Embodiment 1, it is possible to realize a buffer circuit having low power consumption and a small circuit area while maintaining fall time performance.

It should be noted that, continuing from the period (C), the control unit 28 may also keep the input terminal 24 in the floating state in the period (D). In the period (D), the clock signal source 23 changes from the high level to the low level, and thus even in the floating state, a voltage in the order of VDD is maintained in the input terminal 24.

In other words, the controlling by the control unit 28 to cause the first transistor 21 to switch to the conducting state does not always refer to control for applying a voltage to the gate of the first transistor 21. In the same manner, the controlling by the control unit 28 to cause the second transistor 22 to switch the conducting state does not always refer to control for applying a voltage to the gate of the second transistor 22.

In the period (D), when there is no parasitic capacitance in the wire corresponding to the input terminal 24 and there is no leak path through which charge can pass from the input terminal 24, theoretically, the voltage of VDD is maintained in the input terminal 24.

Therefore, even when the high-level voltage is not applied to the input terminal 24, since the ON voltage continues to be applied to the first transistor 21, the low-level voltage of the clock signal source 23 is outputted to the output terminal 26.

It should be noted that it is not necessary for the first transistor 21 to be in the conducting state at all times during the period (D), that is, in the period in which the clock signal is VSS (second voltage). After the output terminal 26 changes to the low level, there is no need for the first transistor 21 to be in the conducting state. The fall time of the output signal can be shortened most effectively when the first transistor 21 and the second transistor 22 are both in the conducting state immediately after the clock signal falls from VDD1 (first voltage) to VSS (second voltage).

It should be noted that the operation of the control unit 28 in the period (D) corresponds to step S702 in FIG. 7.

Furthermore, the clock signal source 23 cyclically changes between the high level and the low level. As such, in period (E) following the period (D), the operation of the control unit 28 is the same as in the period (A). Specifically, the control unit 28 causes the first transistor 21 to switch to the non-conducting state by applying the low-level voltage to the input terminal 24. On the other hand, the control unit 28 applies the ON voltage between the gate and source of the second transistor 22 by applying the high-level voltage to the input terminal 25. With this, the control unit 28 causes the second transistor 22 to switch to the conducting state. Specifically, the output terminal 26 of the buffer circuit 20 is in the low-level state.

At this time, since the output terminal 26 is already in the low level in the period (D), it is sufficient that the control unit 28 drives the second transistor 22 at a level at which signal change does not occur.

It should be noted that the length of the period (D) need not be half the cycle (½ CLK width) of the clock signal source 23 as shown in FIG. 5. The first transistor 21 needs to be in the conducting state only in the period in which the output terminal 26 changes to the low level state. Therefore, in the example in FIG. 5, it is sufficient that the input terminal 24 is in the high level state at least in the period (F).

Furthermore, since the high-level signal is transmitted to the output terminal 26 when the clock signal source 23 changes to the high level when the first transistor 21 is in the conducting state, the control unit 28 needs to cause the first transistor 21 to switch to the non-conducting state before the clock signal level 23 changes to the high level.

It should be noted that the power consumption reducing effect of the buffer circuit 20 according to Embodiment 1 increases when the transistors included in the buffer circuit 20 have depression characteristics (characteristics in which the threshold voltage is low).

Figure 8:
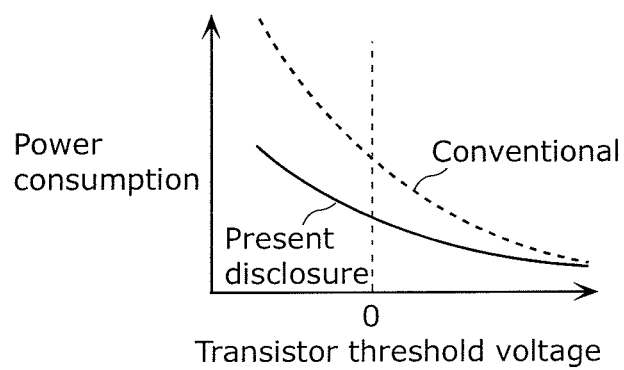
FIG. 8 is a graph showing the relationship between the threshold voltage of a transistor included in a buffer circuit and the power consumption of the buffer circuit.

FIG. 8 is a graph showing the relationship between the threshold voltage of a transistor included in a buffer circuit and the power consumption of the buffer circuit.

It should be noted that FIG. 8 is a graph comparing the case where the buffer circuit 20 according to Embodiment 1 is applied and the second transistor 22 is formed with a reduced channel size and the case where the buffer circuit 20 is not applied and a transistor is formed in the conventional manner.

As shown in FIG. 8, comparing the relationship between power consumption and the threshold voltage of the transistor, the size of the second transistor 22 is small and leak current is reduced in the buffer circuit according to Embodiment 1, and thus power consumption decreases. The more the second transistor 22 has depression characteristics (the region less than or equal to 0 in the horizontal axis in the figure) the more the leak current of the second transistor 22 increases. Therefore, in the case of an n-type TFT, the leak current reducing effect due to the reduction in channel size increases the further the threshold voltage is in the negative direction.

Since such a power consumption reduction allows for a reduction in the width of the power source wire for supplying current, the circuit area can be reduced.

Embodiment 2

The buffer circuit 20 according to Embodiment 1 can be applied to a shift register used in a pixel circuit of a display device.

Figure 9:
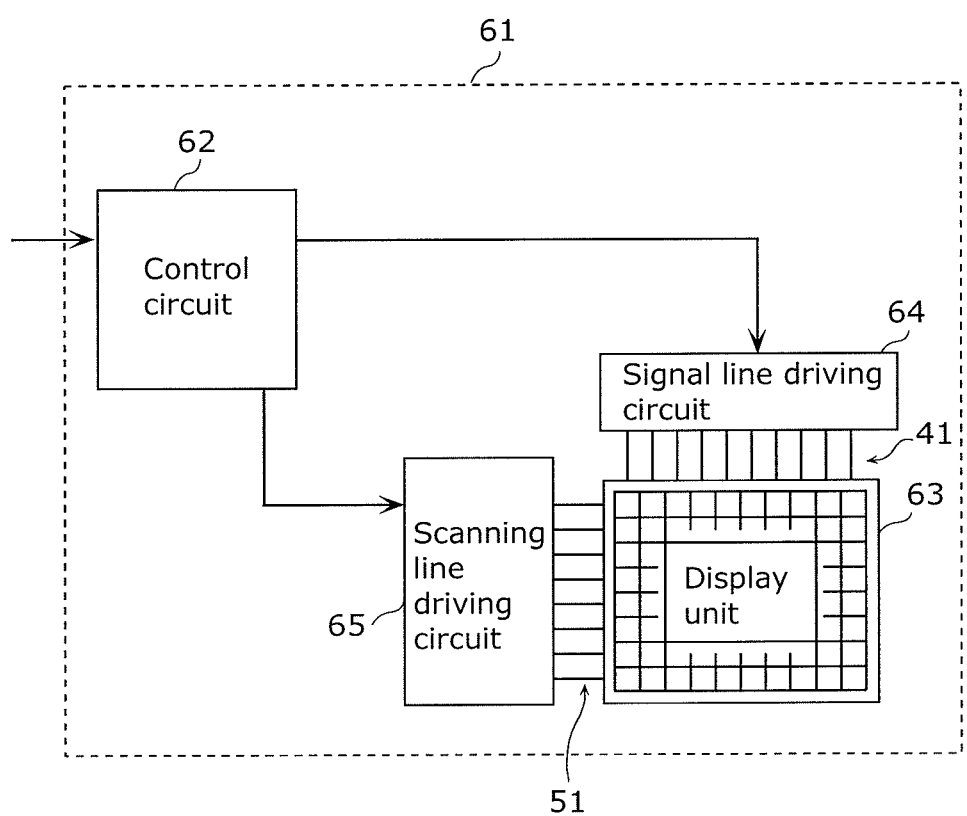
FIG. 9 is a block diagram showing the configuration of a display device according to Embodiment 2.

FIG. 9 is a block diagram showing a configuration of a display device according to Embodiment 2.

A display device 61 is an organic EL display that displays a video signal inputted from an outside source, and includes a control circuit 62, a display unit 63, a signal line driving circuit 64, and a scanning line driving circuit 65.

The control circuit 62 separates the video signal received from the outside source into a synchronizing signal and a pixel signal, and outputs the separated synchronizing signal and pixel signal to the scanning line driving circuit 65 and the signal driving circuit 64, respectively.

The display unit 63 is a display panel composed of pixels that are arranged two-dimensionally.

The signal driving circuit 64 supplies the pixel signal inputted from the control circuit 62 to the display unit 63 via signal lines 41 running in the column direction.

The scanning line driving circuit 65 generates a driving signal for scanning lines by shifting the synchronizing signal inputted from the control circuit 62, using a built-in shift register, and supplies the generated driving signal to the display unit 63 via scanning lines 51 running in the row direction.

Figure 10:
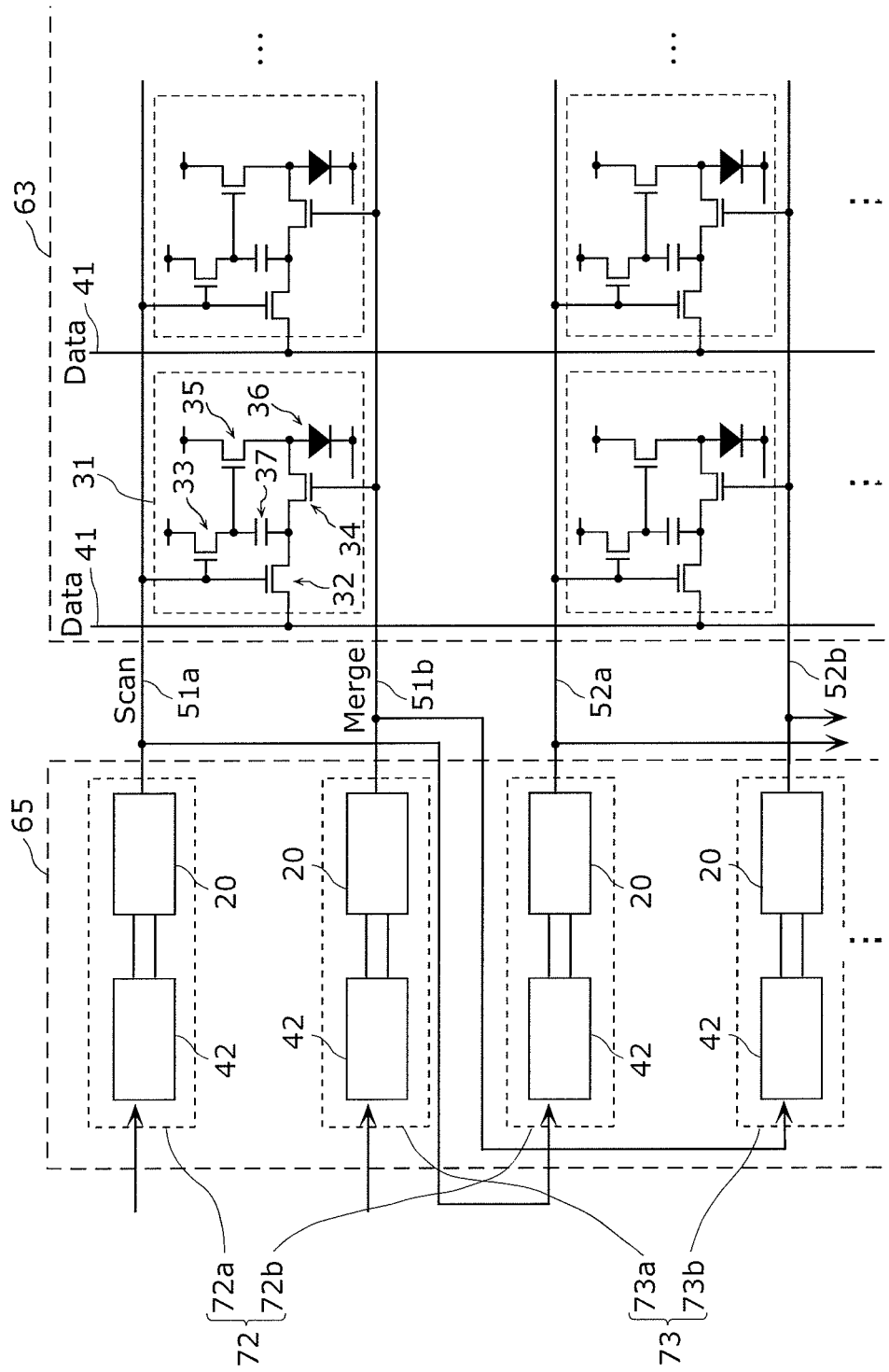
FIG. 10 is a diagram showing the connection relationship between a scanning line driving circuit and a display unit in FIG. 9.

FIG. 10 is a diagram showing the connection relationship between the scanning line driving circuit 65 and the display unit 63 in FIG. 9.

As shown in FIG. 10, each of the pixels (pixel circuits 31) included in the display unit 63 includes three shifting transistors 32 to 34, a driving transistor 35, an organic EL element 36, and a capacitor 37. The switching transistor 32 controls, according to a scan signal inputted from a scanning line 51a, whether or not to hold a pixel signal (data signal) inputted via a signal line 41, in the capacitor 37. The switching transistor 33 controls whether or not to apply the power source voltage to one end of the capacitor 37, according to a scan signal inputted from the scanning line 51a. The switching transistor 34 controls whether or not to connect the capacitor 37 between the gate and the source of the driving transistor 35, according to a merge signal inputted from a scanning line 51b. The driving transistor 35 supplies the organic EL element 36 with current that is in accordance with the voltage held in the capacitor 37.

The scanning line driving circuit 65 includes: a shift register 72 which outputs a driving signal to the scanning lines 51a, 52a, and so on, which are for scan signal use, among the scanning lines 51; and a shift register 73 which outputs a driving signal to the scanning lines 51b, 52b, and so on, which are for merge signal use, among the scanning lines 51.

The shift register 72 for scan signal-use is configured of unit circuits (a first unit circuit 72a, a second unit circuit 72b, and so on) which are connected in multiple stages (in series) and each including a logic circuit 42 and the buffer circuit 20.

In the same manner as the shift register 72, the shift register 73 for merge signal-use is also configured of unit circuits (a first unit circuit 73a, a second unit circuit 73b, and so on) which are connected in multiple stages (in series) and each including a logic circuit 42 and the buffer circuit 20.

In each of the unit circuits included in the shift registers 72 and 73, the buffer circuit 20 receives inputs of two control signals outputted from the logic circuit 42 and outputs a driving signal. Furthermore, together with outputting a driving signal for driving the scanning lines 51, the buffer circuit 20 outputs a signal to the unit circuit in the next stage. It should be noted that details of the unit circuit including the logical circuit 42 shall be described later.

Next, the operation of the display device 61 shall be described.

Figure 11:
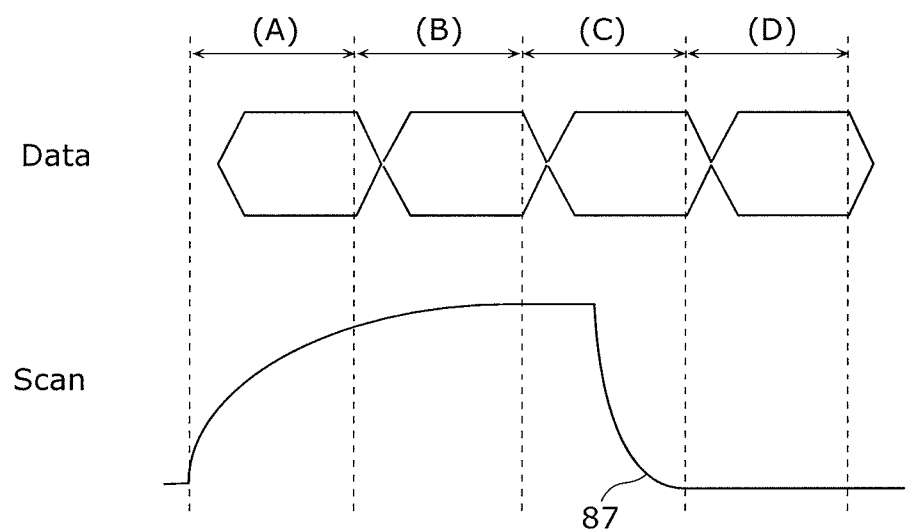
FIG. 11 is a diagram showing an example of a signal waveform used in the operation of a display device.

FIG. 11 is a diagram showing an example of a signal waveform used in the operation of the display device 61.

In the display device 61, a voltage that is in accordance with the data signal is charged (written in) to the capacitor 37 row-sequentially. Therefore, in FIG. 11, the voltage value of the data signal changes for each row of the display unit. Specifically, each of the periods (A) through (D) show the change of voltage values for each row.

When it is desired to cause the organic EL element 36 of the pixel circuit 31 to emit light according to the data signal applied to the data line in the period (C) in FIG. 11, it is sufficient to input a waveform such as that of a scan pulse 87 in FIG. 11 to the scanning line 51 connected to the pixel circuit 31.

This is because, in the case of an active-matrix display device such as an organic EL display, the display luminance of the organic EL element 36 is determined according to the data signal that is inputted last to the pixel circuit 31. As such, it is sufficient that the scan pulse 87 be in the high level in the period (C). Accordingly, since the data signal in the period (C) is written into the capacitor 37, it is possible to cause the organic EL element 36 to emit light in accordance with the data signal in the period (C).

Meanwhile, after the data signal in the period (C) is written into the capacitor 37 of the pixel circuit 31, and before the data signal becomes a voltage (data signal in the period (D)) corresponding to the pixel circuit of the next row, the scan pulse 87 must fall. This is because the data signal in the period (D) corresponding to the pixel circuit of the next row will be written into the pixel circuit 31. As such, the fall time needs to be short.

Here, by using the buffer circuit 20 which improves fall time, it is possible to reduce the size of the second transistor 22 which is normally formed with a large channel size for the purpose of hastening fall time, in a shift register of the display device. Therefore, the circuit area can be reduced.

Next, an example of the unit circuit shown in FIG. 10 shall be described.

Figure 12:
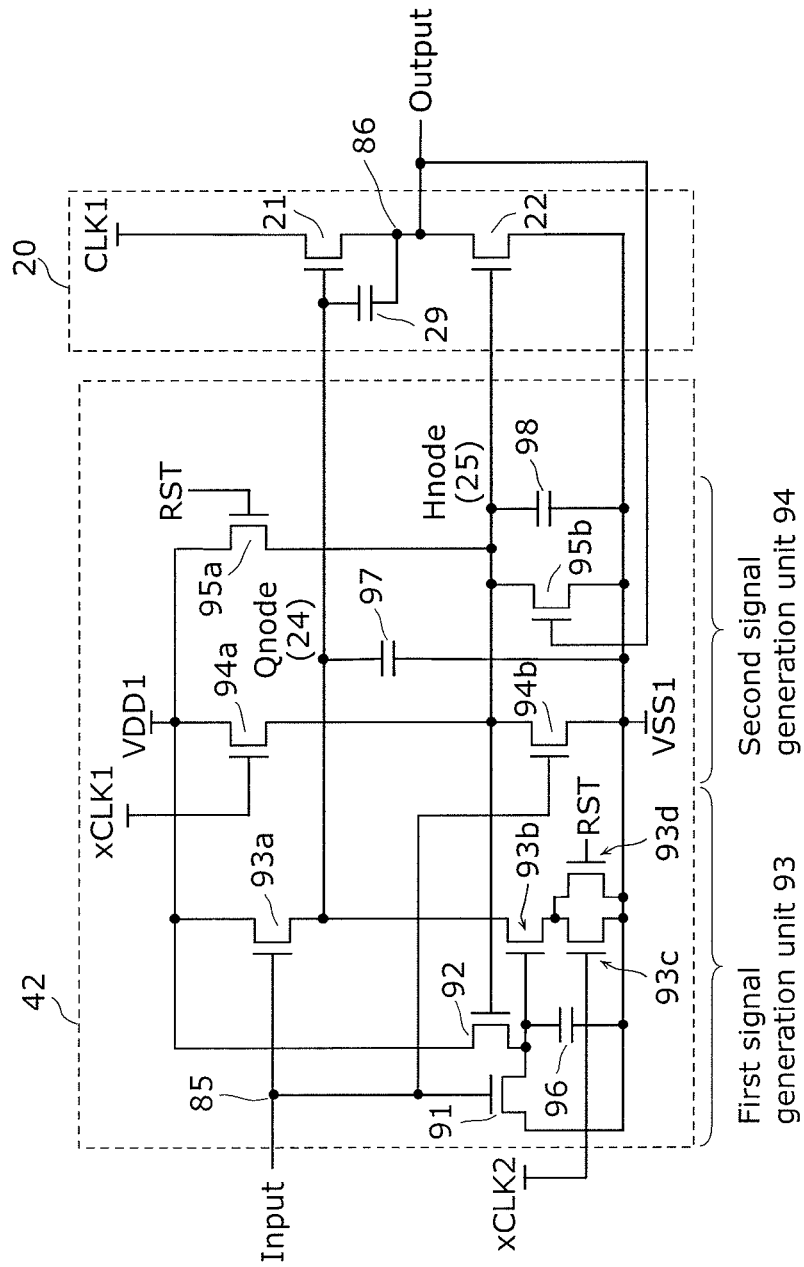
FIG. 12 is diagram showing an example of the circuit configuration of a unit circuit.

FIG. 12 is diagram showing an example of a circuit configuration of a unit circuit.

The unit circuit shown in FIG. 12 is a circuit which outputs to an output terminal 86 a pulse required for the scan lines, using three clock lines and a pulse output of the preceding stage inputted to an input terminal 85. The unit circuit is controlled by inputting waveforms such as those shown in FIG. 13.

The buffer circuit 20 is the same as that described in Embodiment 1. It should be noted that, as in Embodiment 1, the control line Qnode in the middle of the figure is the input terminal 24 of the buffer circuit 20, and the control line Hnode is the input terminal 25 of the buffer circuit 20.

The logic circuit 42 includes ten transistors, 91, 92, 93a to 93d, 94a, 94b, 95a, and 95b, and three capacitors, 96 to 98. It should be noted that the capacitors 96 to 98 provided in three locations are provided for holding the potential of the signal line connected thereto. As such, they are not essential components.

The transistors 91, 92, and 93a to 93d are included in a first signal generation unit 93 which outputs, to the control line Qnode, a first signal for controlling the conduction and non-conduction of the first transistor 21 of the buffer circuit 20.

Furthermore, the transistors 94a, 94b, 95a, and 95b are included in a second signal generation unit 94 which outputs, to the control line Hnode, a second signal for controlling the conduction and non-conduction of the second transistor 22 of the buffer circuit 20.

Next, the operation of the unit circuit shown in FIG. 12 shall be described.

Figure 13:
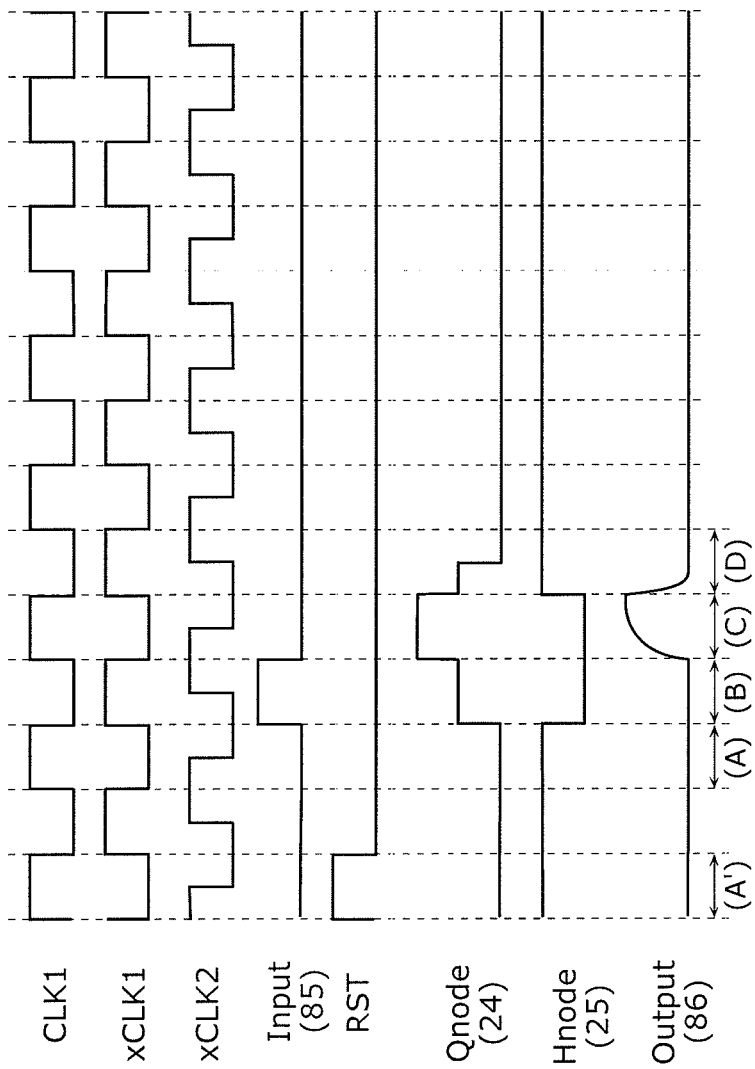
FIG. 13 is a timing chart showing the operation of the unit circuit shown in FIG. 12.

FIG. 13 is a timing chart showing the operation of the unit circuit shown in FIG. 12. Here, clock signals CLK1, xCLK1, and xCLK2, a voltage waveform at the input terminal 85, a voltage waveform at an RST terminal, a voltage waveform (first signal) at the control line Qnode, a voltage waveform (second signal) at the control line Hnode, and a voltage waveform at the output terminal 86 are illustrated. Each of the clock signals CLK1, xCLK1, and xCLK2 is a signal that assumes the two phases VDD1 and VDD2. It should be noted that, in the subsequent description, unless otherwise stated, high level refers to the power source voltage VDD1 and low level refers to the power source voltage VSS1.

In FIG. 13, first, a reset signal is inputted to the RST terminal in period (A'). It should be noted that the RST terminal and the reset signal may be provided as necessary, and are not essential components of the present circuit. Since the transistor 95a turns ON as a result of the reset signal being inputted to the RST terminal in the period (A'), the control line Hnode reliably changes to the high level. Therefore, the transistors 92 and 93b are turned ON.

Furthermore, since the transistor 93d turns ON as a result of the reset signal being inputted to the RST terminal in the period (A'), the control line Qnode reliably changes to the low level.

Therefore, in the period (A'), the output terminal 86 is in the low level because the first transistor 21 is OFF and the second transistor 22 is ON. This state is maintained from the period (A') to the period (A), through a capacitor 97 and a capacitor 98.

In period (B), the high level voltage is inputted to the input terminal 85, and the xCLK1 is in the high level, and thus the transistors 95a and 95b are OFF and the transistors 94a and 94b turn ON. Here, the size of transistors 94a and 94b is set so that the control line Hnode changes to the low level when both xCLK1 and the input terminal change to the high level. Therefore, the control line Hnode changes to the low level.

Furthermore, in the period (B), the transistors 91 and 93a are ON and the transistor 93b is OFF as a result of the high level voltage being inputted to the input terminal 85, and thus the control line Qnode changes to the high level. At this time, although the first transistor 21 is ON and the second transistor 22 is OFF, the output terminal 86 is in the low level because CLK1 is in the low level. Furthermore, in the time (B), the capacitor element 29 is charged with the high-level voltage applied to the control line Qnode.

Next, in period (C), the input terminal 85 changes to the low level and the transistors 91 and 93a turn OFF, and thus the control line Qnode changes to the floating state. Here, since CLK1 rises to the high level, the voltage at the control line Qnode becomes a voltage obtained by adding the high level voltage of CLK1 to the voltage with which the capacitor element 29 is charged in the time (B), due to the bootstrapping described in Embodiment 1. Specifically, the voltage at the control line Qnode becomes a voltage of 2×VDD1 in an ideal state.

In the period (C), the control line Hnode is in the floating state since the transistors 94a, 94b, 95a, and 95b are OFF until the voltage at the output terminal 86 exceeds the threshold voltage of the transistor 95b. From the time when the voltage at the output terminal 86 exceeds the threshold voltage of the transistor 95b, the transistor 95b turns ON, and thus the control line Hnode changes to the low level.

The input terminal 86 rises to the high level since the aforementioned voltage is applied to the control line Qnode and CLK1 rises to the high level here.

In the period (D), xCLK1 is in the high level and the transistor 94a is ON, and thus the control line Hnode changes to the high level.

In contrast, since the control line Qnode continues to be in the floating state from the period (C), the control line Qnode is in the high level in the first half of the period (D). With this, as described in the operation of the buffer circuit 20, the voltage of the output terminal 86 falls sharply from the high level to the low level. Furthermore, in the second half of the period (D), the xCLK2 rises to the high level and the transistor 93c turns ON. Moreover, at this time, the transistors 92 and 93b are ON in response to the high level of the control line Hnode, and thus the control line Qnode changes to the low level.

As described above, the buffer circuit 20 can be applied to a shift register (unit circuit including the logic circuit 42 and the buffer circuit 20) used in a pixel circuit of a display device. Accordingly, it is possible to reduce the size of the second transistor 22 which is normally formed with a large channel size for the purpose of hastening the fall time. Therefore, the circuit area can also be reduced in the shift register.

Furthermore, the logical circuit 42 is not limited to the circuit in FIG. 12.

Figure 14:
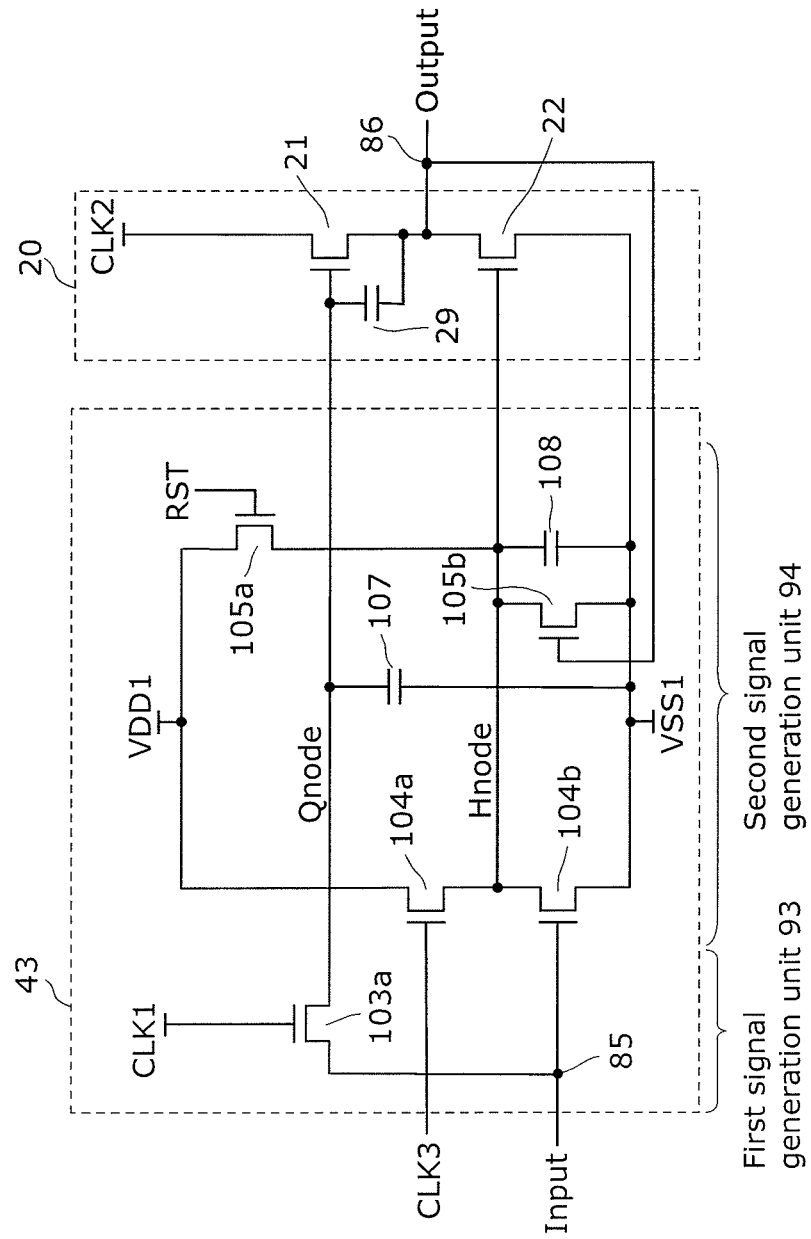
FIG. 14 is a diagram showing an example of the circuit configuration of a unit circuit using a different logic circuit.

FIG. 14 is a diagram showing an example of the circuit configuration of a unit circuit using a different logic circuit.

The unit circuit shown in FIG. 14 is a circuit which outputs to the output terminal 86 a pulse required for the scan lines, using three clock lines and a pulse output of the preceding stage inputted to the input terminal 85.

The buffer circuit 20 is the same as that described in Embodiment 1. It should be noted that, as in Embodiment 1, the control line Qnode in the middle of the figure is the input terminal 24 of the buffer circuit 20, and the control line Hnode is the input terminal 25 of the buffer circuit 20.

A logical circuit 43 includes five transistors, 103a, 104a, 104b, 105a, and 105b, and two capacitors, 107 and 108. It should be noted that the capacitors 107 and 108 provided in two locations are provided for holding the potential of the signal line connected thereto. As such, they are not essential components.

Furthermore, the transistor 103a is included in the first signal generation unit 93 which outputs, to the control line Qnode, the first signal for controlling the conduction and non-conduction of the first transistor 21 of the buffer circuit 20.

Furthermore, the transistors 104a, 104b, 105a, and 105b are included in the second signal generation unit 94 which outputs, to the control line Hnode, the second signal for controlling the conduction and non-conduction of the second transistor 22 of the buffer circuit 20.

The difference with the circuit configuration in FIG. 12 is that, due to the adjustment of the size of the transistors 94a and 94b, there is no configuration for determining the logic (high level/low level) for the control line Hnode. With this, each of the transistors can be individually designed with the optimal size.

Next, the operation of the unit circuit shown in FIG. 14 shall be described.

Figure 15:
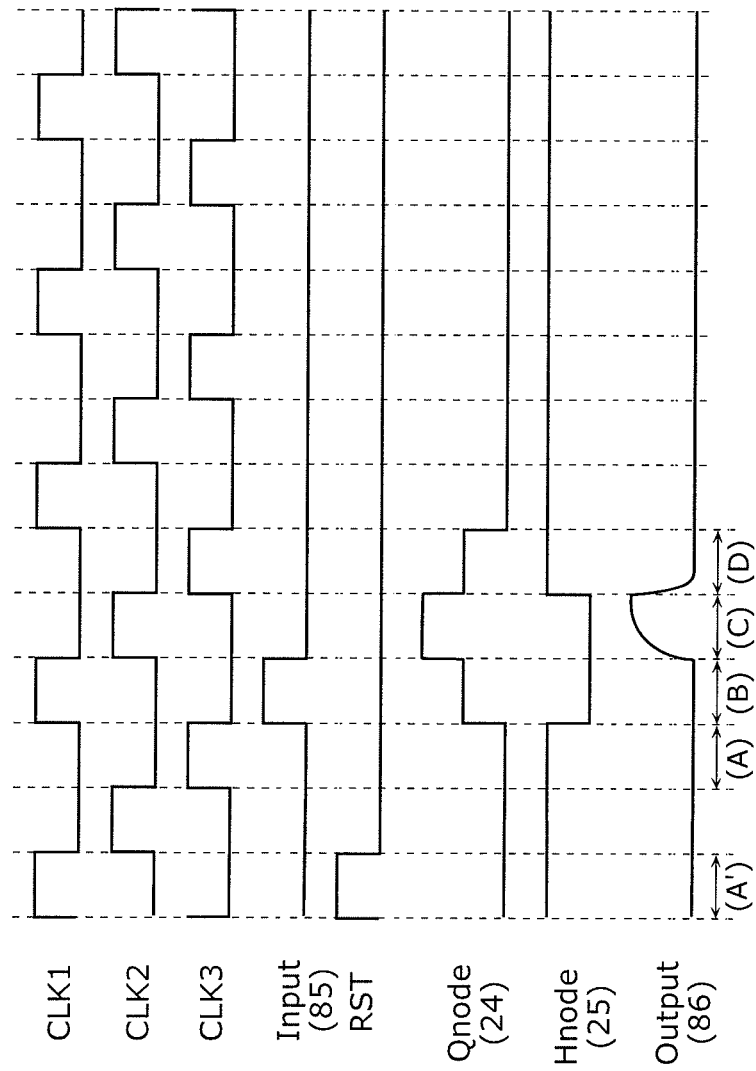
FIG. 15 is a timing chart showing the operation of the unit circuit shown in FIG. 14.

FIG. 15 is a timing chart showing the operation of the unit circuit shown in FIG. 14. Here, clock signals CLK1, CLK2, and CLK3, a voltage waveform at the input terminal 85, a voltage waveform at an RST terminal, a voltage waveform (first signal) at the control line Qnode, a voltage waveform (second signal) at the control line Hnode, and a voltage waveform at the output terminal 86 are illustrated. Each of the clock signals CLK1, CLK2, and CLK3 is a signal that assumes the two phases VDD1 and VSS1. It should be noted that, in the subsequent description, unless otherwise stated, high level refers to the power source voltage VDD1 and low level refers to the power source voltage VSS1.

In FIG. 15, first, a reset signal is inputted to the RST terminal in period (A'). It should be noted that the RST terminal and the reset signal may be provided as necessary, and are not essential components of the present circuit.

Since the transistor 105a turns ON as a result of the reset signal being inputted to the RST terminal in the period (A'), the control line Hnode reliably changes to the high level.

Furthermore, in the period (A'), CLK1 is in the high level and thus the transistor 103a turns ON, and the control line Qnode is in the conducting state with the input terminal 85. Therefore, the control line Qnode changes to the low level in the same manner as the input terminal 85.

Therefore, in the period (A'), the output terminal 86 is in the low level because the first transistor 21 is OFF and the second transistor 22 is ON. This state is maintained from the period (A') to the period (A), though capacitors 107 and 108.

In the period (B), the high level voltage is inputted to the input terminal 85, and thus the transistor 104b turns ON and the control line Hnode changes to the low level.

Furthermore, in the period (B), in addition to the input terminal 85, CLK1 is also in the high level, and thus the transistor 103a turns ON and the control line Qnode changes to the high level.

Therefore, in the period (B), the output terminal 86 is in the low level.

Furthermore, in the time (B), the capacitor element 29 is charged with the high-level voltage applied to the control line Qnode.

Next, in period (C), the input terminal 85 changes to the low level and the transistor 104b turns OFF. As such, the control line Hnode is in the floating state since the transistors 104a, 104b, 105a, and 105b are OFF until the voltage at the output terminal 86 exceeds the threshold voltage of the transistor 105b. From the time when the voltage at the output terminal 86 exceeds the threshold voltage of the transistor 105b, the transistor 105b turns ON, and thus the control line Hnode changes to the low level.

Furthermore, in the period (C), in addition to the input terminal 85, CLK1 is also in the low level, and thus the transistor 103a turns OFF and the control line Qnode changes to the floating state. Here, since CLK2 rises to the high level, the voltage at the control line Qnode becomes a voltage obtained by adding the high level voltage of CLK2 to the voltage with which the capacitor element 29 is charged in the time (B), due to the bootstrapping described in Embodiment 1. Specifically, voltage at the control line Qnode becomes a voltage of 2×VDD1 in an ideal state.

In the period (C), the input terminal 86 rises to the high level since the aforementioned voltage is applied to the control line Qnode and CLK2 rises to the high level here.

In the period (D), CLK3 is in the high level and the transistor 104a is ON, and thus the control line Hnode changes to the high level.

Furthermore, since the control line Qnode is in the floating state continuing from the period (C), the control line Qnode is in the high level in the period (D). With this, as described in the operation of the buffer circuit 20, the voltage of the output terminal 86 falls sharply from the high level to the low level.

As described above, the logic circuit used in the unit circuit is not limited to the circuit shown in FIG. 12. It should be noted that as long as the logic circuit is a circuit that can cause the buffer circuit 20 to function appropriately as a scan line driving circuit and a merge line driving circuit configurations other than those in FIG. 12 and FIG. 14 are also acceptable.

Embodiment 3

In Embodiment 3, an example where, in a display device, the buffer circuit 20 is applied to a shift register having a different configuration than that in Embodiment 2 shall be described. It should be noted that the overall configuration of the display device is the same as the configuration shown in FIG. 9. With regard to the rest of the components, those components that are given the same reference signs as in Embodiment 1 and Embodiment 2 have the same operation and function, and thus description shall not be repeated.

Figure 16:
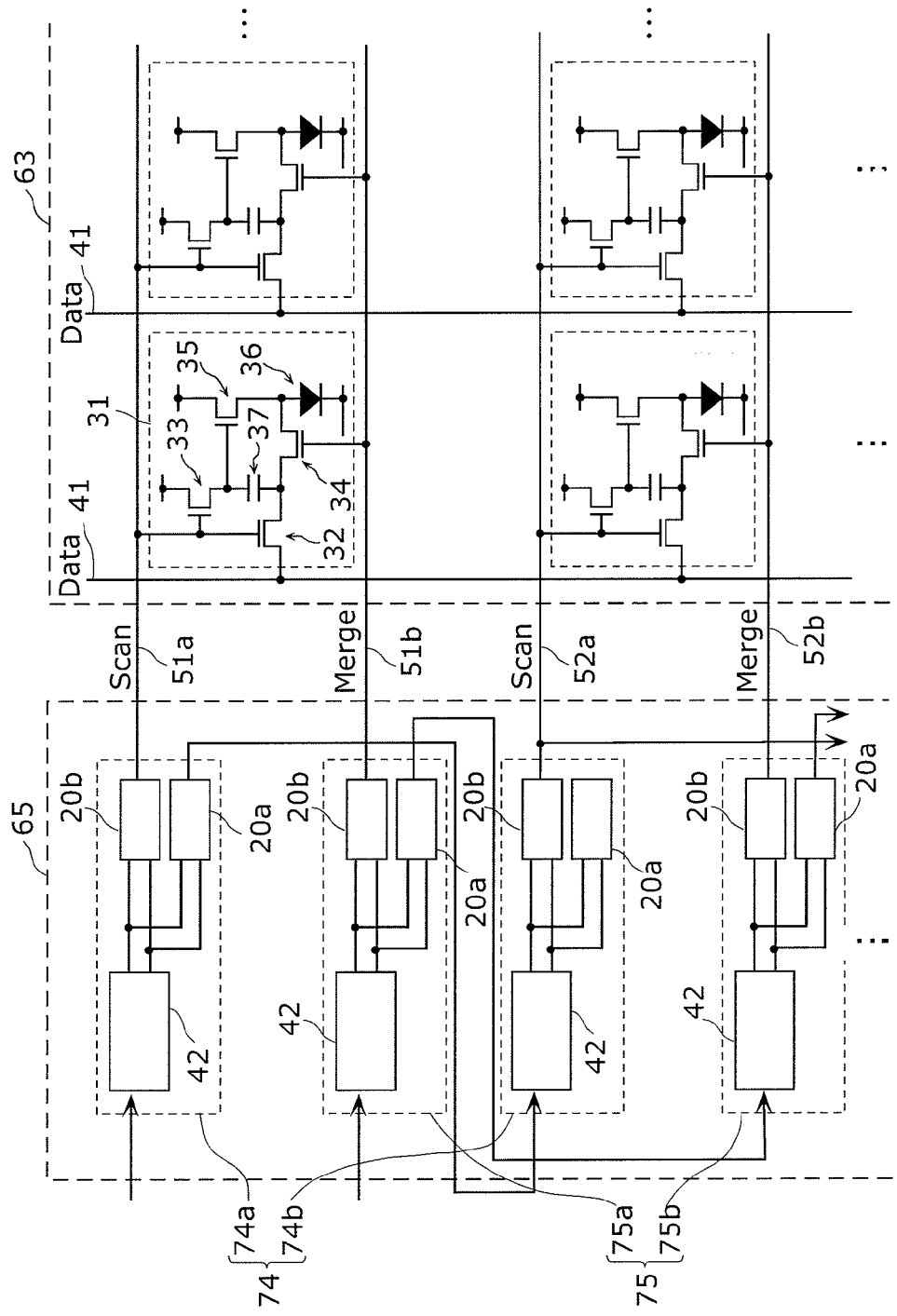
FIG. 16 is a diagram showing the connection relationship between a scanning line driving circuit and a display unit according to Embodiment 3.

FIG. 16 is a diagram showing the connection relationship between a scanning line driving circuit 65 and a display unit 63 according to Embodiment 3.

The scanning line driving circuit 65 includes: a shift register 74 which outputs a driving signal to the scanning lines 51a, 52a, and so on, which are for scan signal use, among the scanning lines 51; and a shift register 75 which outputs a driving signal to the scanning lines 51b, 52b, and so on, which are for merge signal use, among the scanning lines 51.

The point of difference of the shift registers 74 and 75 from the shift registers 72 and 73 in Embodiment 2, is that a single unit circuit includes one of the logic circuit 42 and two buffer circuits 20a and 20b.

Specifically, the shift register 74 for scan signal-use is configured of unit circuits (a first unit circuit 74a, a second unit circuit 74b, and so on) which are connected in multiple stages (in series) and each including the logic circuit 42, the buffer circuit 20a, and the buffer circuit 20b.

The shift register 75 for merge signal-use is also configured of unit circuits (a first unit circuit 75a, a second unit circuit 75b, and so on) which are connected in multiple stages (in series) and each including the logic circuit 42, the buffer circuit 20a, and the buffer circuit 20b.

In each of the unit circuits included in the shift registers 74 and 75, both the buffer circuit 20a and the buffer circuit 20b receive inputs of two control signals outputted from the logic circuit 42 and output a driving signal. The buffer circuit 20b outputs driving signal for driving the scanning lines 51. In contrast, the buffer circuit 20a outputs a signal to the unit circuit in the next stage.

In this manner, in each of the unit circuits of the shift registers 74 and 75, the output stage is configured of two parallel connected buffer circuits, 20a and 20b, which have different current driving performance.

The buffer circuit 20a needs to output a driving signal that requires a large current because a voltage that is in accordance with the data voltage is to be applied to the capacitor 37. In contrast, the buffer circuit 20b needs to output a driving signal that has no dulling in waveform despite not requiring a large current.

Therefore, in this manner, by providing separate circuits as the buffer circuit 20b for driving the scanning lines 51 and the buffer circuit 20a which outputs a signal to the unit circuit in the next stage, the size of the transistor included in the buffer circuit 20a and which does not require a large driving current can be reduced. Since driving current capacity is not required, the gate width of the transistor included in the buffer circuit 20a can be reduced to approximately ½ to 1/100 of the gate width of the transistor included in the buffer circuit 20b.

Accordingly, compared to the configuration in which the driving signal and the signal to the next stage are outputted from a common output unit, the flow-through current (power consumption) originating from the buffer circuit 20 is suppressed.

Furthermore, by adopting separate configurations for the buffer circuit 20b for driving the scanning lines 51 and the buffer circuit 20a which outputs a signal to the unit circuit in the next stage, the signal voltage for driving the signal lines 51 and the signal voltage outputted to the circuit in the next stage can be set separately.

Next, the detailed configuration of the unit circuit shall be described.

Figure 17:
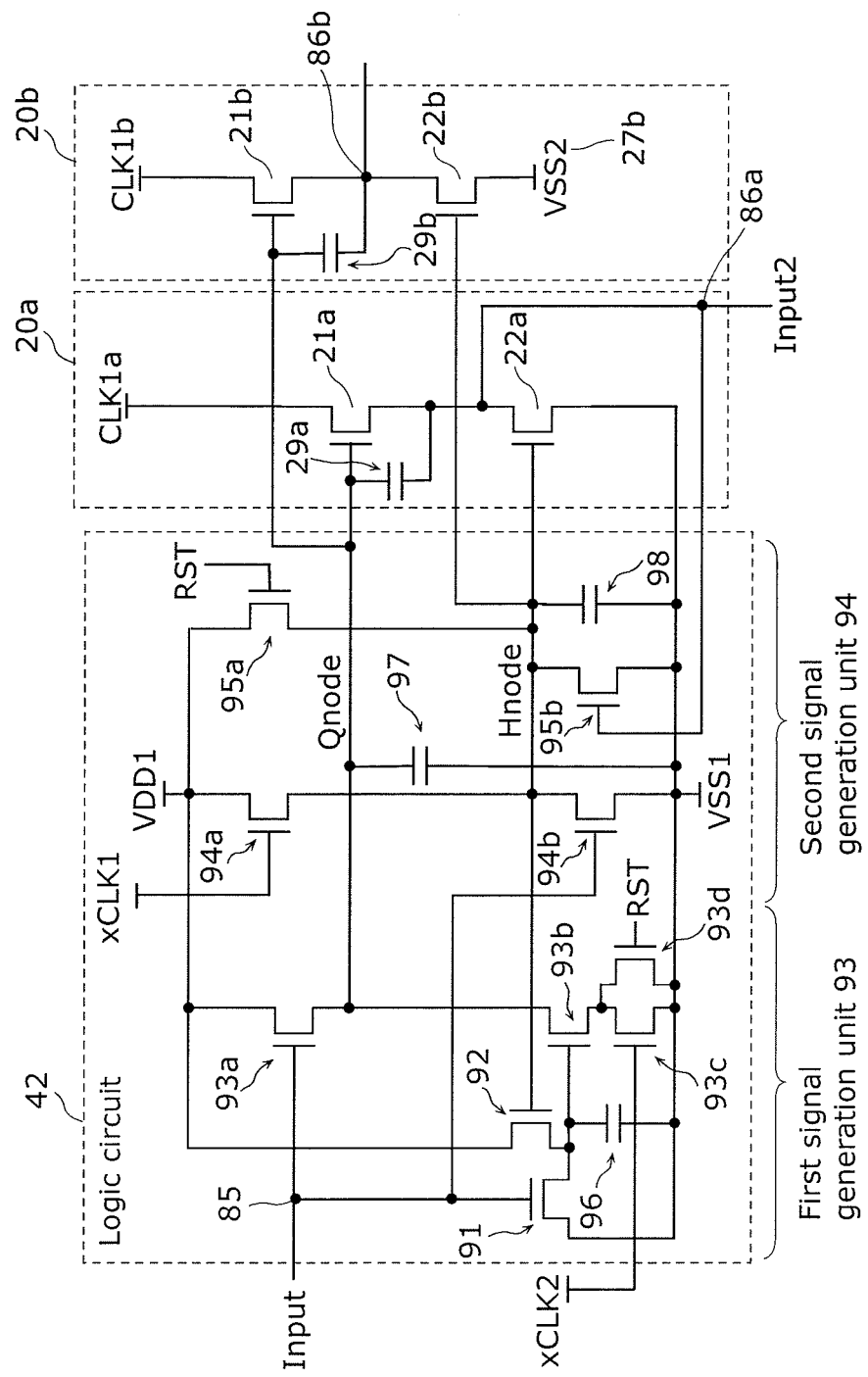
FIG. 17 is a diagram showing an example of the circuit configuration of a unit circuit according to Embodiment 3.

FIG. 17 is a diagram showing an example of the circuit configuration of the unit circuit according to Embodiment 3.

The buffer circuits 20a and 20b are the same as the buffer circuit 20 described in Embodiment 1. It should be noted that, in the same manner as in Embodiment 1, the control line Qnode at the center of the figure is an input terminal 24a of the buffer circuit 20a and an input terminal 24b of the buffer circuit 20b. In the same manner, the control line Hnode is an input terminal 25a of the buffer circuit 20a and an input terminal 25b of the buffer circuit 20b.

The logical circuit 42 is the same as the logic circuit shown in FIG. 12. It should be noted that the gate of a transistor 95b is connected to the output terminal 86a (an input terminal Input2 of the circuit in the next stage) of the buffer circuit 20a.

The unit circuit shown in FIG. 17 is characterized in that different clock signals, CLK1a and CLK 1b, are supplied to the buffer circuit 20a and the buffer circuit 20b, respectively. It should be noted that, although the high level of the clock signals CLK1a and CLK1b is the power source voltage VDD1 and the low level is the power source voltage VSS1, the voltage of a low-voltage source 27b is VSS2.

Here, the low-level voltage (second voltage) VSS1 of CLK1b is lower than the voltage (third voltage) VSS2 of the low-voltage source 27b.

Accordingly, when a second transistor 22b is controlled, it becomes possible to set the gate-source voltage of the second transistor 22b to a negative value, and thus in the case where the second transistor 22b has depression characteristics, the leak current can be reduced.

Furthermore, as described above, compared to a second transistor 22a, the size of the second transistor 22b becomes 2 to 100 times bigger. Therefore, since the leak current of the second transistor 22b easily becomes big, making the low-level voltage of CLK1b lower than the voltage of the low-voltage source 27b, as in the present configuration, is extremely effective in reducing power consumption.

In addition, by making the low-level voltage of CLK1b lower than the voltage of the low-voltage source 27b, the fall time of the signal outputted to an output terminal 86b can be further reduced.

Figure 18:
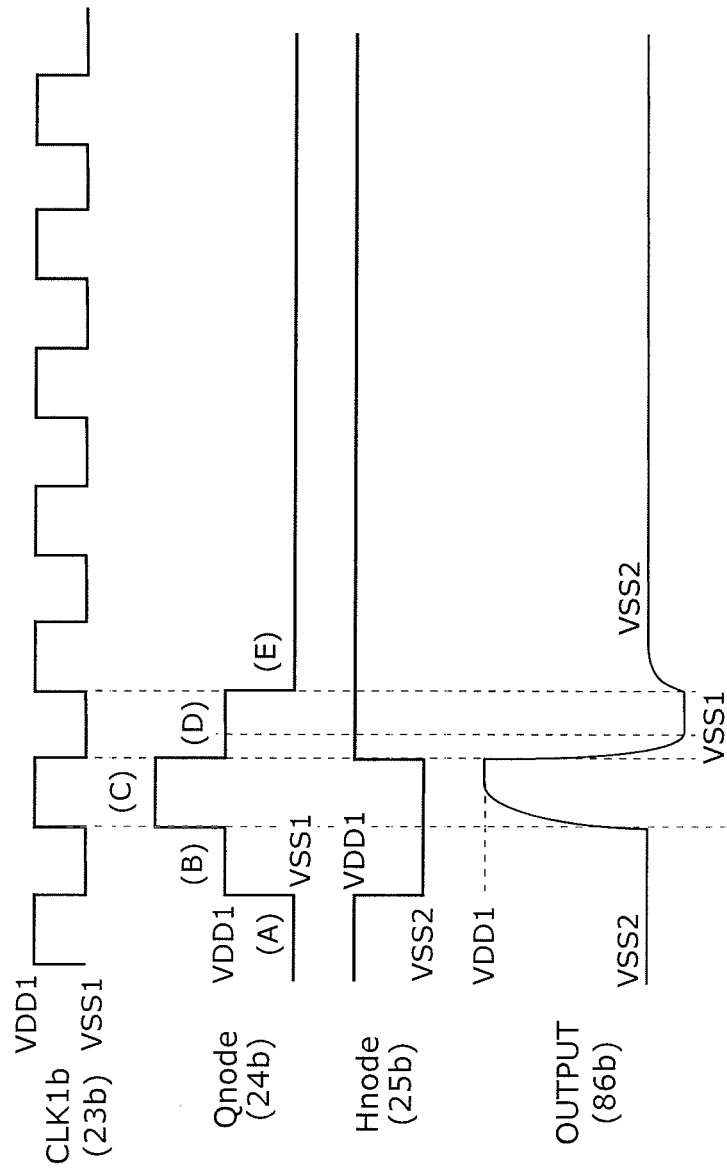
FIG. 18 is a timing chart showing the operation of the unit circuit shown in FIG. 17.

FIG. 18 is a timing chart showing the operation of the unit circuit shown in FIG. 17.

Here, the clock signal CLK1b, a voltage waveform (first signal) at the control line Qnode, a voltage waveform (second signal) at the control line Hnode, and a voltage waveform at the output terminal 86 are illustrated.

In FIG. 18, in period (A), the voltage of the control line Qnode is changed to the low level (VSS1) by the first signal generation unit 93, and the voltage of the control line Hnode is changed to the high level (VDD1) by the second signal generation unit 94. Therefore, in the buffer circuit 20b, a first transistor 21b turns OFF and a second transistor 22b turns ON, and thus the reference voltage VSS2 is outputted to the output terminal 86b.

In period (B), the voltage of the control line Qnode is changed to the high level (power source voltage VDD1) by the first signal generation unit 93, and the voltage of the control line Hnode is changed to the low level (reference voltage VSS1) by the second signal generation unit 94. Therefore, in the buffer circuit 20b, the first transistor 21b turns ON and a second transistor 22b turns OFF, and thus the potential (reference voltage VSS2) of the clock signal CLK1b is outputted to (is maintained as reference voltage VSS2 in) the output terminal 86b.

In period (C), the first signal generation unit 93 changes to high-impedance output, and thus the first signal generation unit 93 and the gate (control terminal) of the first transistor 21b and first transistor 21a are electrically cut-off. On the other hand, the control line Hnode is kept in the low level (reference voltage VSS1) by the second signal generation unit 94. Then, the clock signal CLK1b passing through the first transistor 21b rises, there is positive feedback of such level change to the gate of the first transistor 21b via a capacitor element 29b and bootstrapping occurs, and thus the first transistor 21b is kept ON and the high-level voltage (power source voltage VDD1) of the clock signal CLK1b is outputted to the output terminal 86b.

In period (D), the high-impedance output of the first signal generation unit 93 is maintained and the voltage of the control line Hnode is changed to the high level (power source voltage VDD1) by the second signal generation unit 94. Then, the clock signal CLK1b passing through the first transistor 21b falls, and the charge accumulated in the output terminal 86b drops to the reference voltage VSS1 via the first transistor 21b which is ON. In the same manner, the charge accumulated in the output terminal 86b drops to the reference voltage VSS2 via the second transistor 22b.

Therefore, the voltage of the output terminal 86b changes to the VSS2 level (low level) after sharply falling to VSS1 (overdrive), as shown in FIG. 18. Specifically, fall time is shortened further than in Embodiment 1.

In period (E), the same operation is carried out as in period (A).

It should be noted that, in the case of the potential difference between VSS2 and VSS1, a potential difference that is bigger than (second transistor 22b threshold voltage—1) V is most effective for power consumption reduction.

Furthermore, although the fall time of the signal of the output terminal 86 can be shortened by further lowering the voltage of VSS1, in this case, the potential difference between the high level and the low level in the buffer circuit 20b becomes big, and thus the power consumption of the buffer circuit 20b increases. Therefore, it is preferable to confine VSS1 to about (second transistor 22b threshold voltage—5) V at most.

Buffer circuits and driving methods thereof have been described up to this point based on the embodiments.

The buffer circuit and the method of driving the buffer circuit according to one or more exemplary embodiments disclosed herein are capable of simultaneously achieving circuit area reduction and power consumption reduction.

Figure 19:
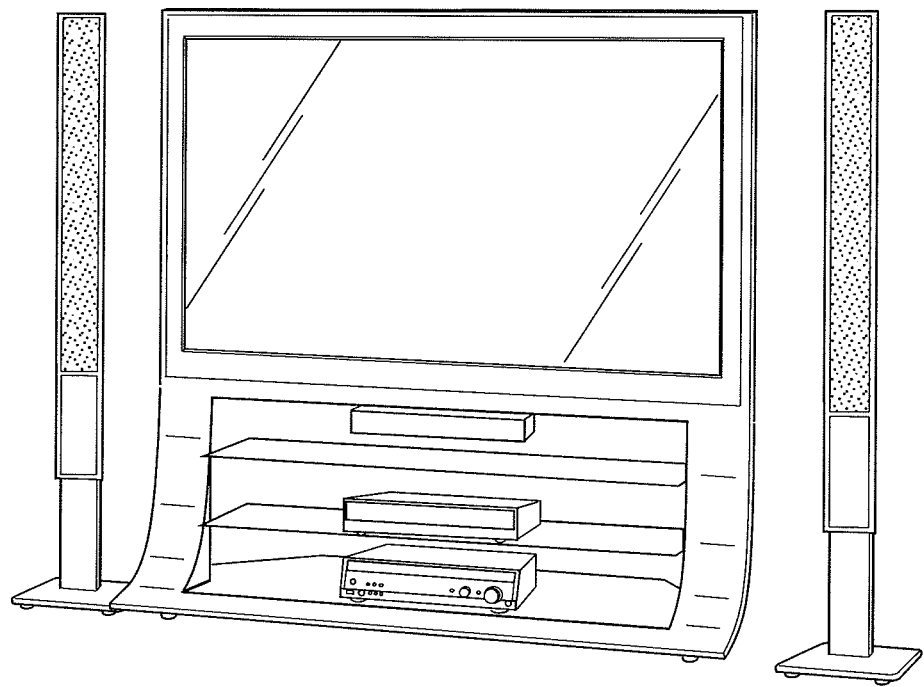
FIG. 19 is an external view of a thin flat-screen TV incorporating the buffer circuit disclosed herein.

Furthermore, for example, a buffer circuit according to one or more exemplary embodiments disclosed herein can be applied to a shift register of a display device and be built into a thin flat-screen TV such as that shown in FIG. 19. This allows for the realization of a high-definition thin flat-screen TV having improved performance such as reduced power consumption and increased integration.

The herein disclosed subject matter is to be considered descriptive and illustrative only, and the appended Claims are of a scope intended to cover and encompass not only the particular embodiment(s) disclosed, but also equivalent structures, methods, and/or uses.

For example, although the transistors included in the buffer circuit are n-type transistors in the embodiments, the transistors are not limited to such. The transistors included in the buffer circuit may be p-type transistors, or a mixture of n-type transistors and p-type transistors. Furthermore, the transistors included in the buffer circuit may be either MOS transistors or MIS transistors.

Furthermore, the transistors included in the buffer circuit are not particularly limited and may be amorphous silicon TFTs, polysilicon TFTs, oxide TFTs, and so on. The buffer circuits according to the present invention are particularly effective with TFTs having low carrier mobility and a large channel size or TFTs having depression characteristics.

Furthermore, the buffer circuits may be configured of switching elements, aside from transistors. In other words, the buffer transistor may have a configuration in which switching elements are connected in series via output terminals.

Furthermore, aside from organic EL displays, the present invention can be applied to liquid-crystal display devices as long as these are active-matrix display devices.

Each of the structural elements in each of the above-described embodiments may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory.

INDUSTRIAL APPLICABILITY

Buffer circuits and methods of driving the buffer circuit according to one or more exemplary embodiments disclosed herein can be applied to a shift register of a display device, and allow shortening of scanning line drive signal fall time and reduction of circuit area. Therefore, the buffer circuits and methods of driving the buffer circuit can be used in an organic EL display device used in a television, computer, lighting device, and so on.

The invention claimed is:

1. A buffer circuit driving method for driving a buffer circuit including: an output terminal; a first transistor connected to a signal source of a clock signal that is of at least a first voltage or a second voltage lower than the first voltage, for supplying the first voltage to the output terminal; and a second transistor connected to a voltage source that supplies a third voltage lower than the first voltage, for supplying the third voltage to the output terminal, the buffer circuit driving method comprising:

causing the first transistor to switch to a conducting state in a period in which the clock signal is of the first voltage; and causing both the first transistor and the second transistor to switch to the conducting state in a period in which the clock signal is of the second voltage, following the period in which the clock signal is of the first voltage, wherein a period in which both the first transistor and the second transistor are in the conducting state is a half cycle of the clock signal.

2. The buffer circuit driving method according to claim 1, wherein the output terminal outputs the second voltage in a period in which both the first transistor and the second transistor are in the conducting state.

3. The buffer circuit driving method according to claim 1, wherein the buffer circuit is provided in a scanning line driving circuit that generates a driving signal for scanning lines of a display, and a signal of the first voltage, the second voltage and the third voltage output from the output terminal is supplied to the display as the driving signal, but is not supplied to the scanning line driving circuit.

4. The buffer driving method according to claim 3, wherein the buffer circuit further includes a second output terminal separately from the output terminal, and the second output terminal outputs a signal only to the scanning line driving circuit.

5. The buffer driving method according to claim 1, wherein the second voltage is set lower than the third voltage, and the output terminal outputs the first voltage, the second voltage and the third voltage.

6. A buffer circuit comprising:

an output terminal;

a first transistor connected to a signal source of a clock signal that is of at least a first voltage or a second voltage lower than the first voltage, for supplying the first voltage to the output terminal; and a second transistor connected to a voltage source that supplies a third voltage lower than the first voltage, for supplying the third voltage to the output terminal, wherein the first transistor is caused to switch to a conducting state in a period in which the clock signal is of the first voltage, and both the first transistor and the second transistor are caused to switch to the conducting state in a period in which the clock signal is of the second voltage, following the period in which the clock signal is of the first voltage, and a period in which both the first transistor and the second transistor are in the conducting state is a half cycle of the clock signal.

7. The buffer circuit according to claim 6, wherein the first transistor has a gate connected to the output terminal via a capacitor element.

8. A shift register comprising unit circuits connected in multiple stages and each including a logic circuit and an output including the buffer circuit according to claim 6, wherein the logic circuit includes:

a first signal generator configured to generate, according to a signal input from one of the unit circuits which is in an immediately preceding stage, a first signal for switching the first transistor between the conducting state and a non-conducting state; and a second signal generator configured to generate a second signal for switching the second transistor between the conducting state and the non-conducting state.

9. The buffer circuit according to claim 6, wherein the first transistor and the second transistor have depression characteristics.

10. The buffer circuit according to claim 6, wherein the output terminal outputs the second voltage in a period in which both the first transistor and the second transistor are in the conducting state.

11. The buffer circuit according to claim 6, wherein the buffer circuit is provided in a scanning line driving circuit that generates a driving signal for scanning lines of a display, and a signal of the first voltage, the second voltage and the third voltage output from the output terminal is supplied to the display as the driving signal, but is not supplied to the scanning line driving circuit.

12. The buffer circuit according to claim 11, wherein the buffer circuit further includes a second output terminal separately from the output terminal, and the second output terminal outputs a signal only to the scanning line driving circuit.

* * * * *

UNITED STATES PATENT AND TRADEMARK OFFICE
CERTIFICATE OF CORRECTION

| | | |
|---|---|---|
| PATENT NO. | : 8,824,622 B2 | Page 1 of 1 |
| APPLICATION NO. | : 13/735354 | |
| DATED | : September 2, 2014 | |
| INVENTOR(S) | : Hitoshi Tsuge et al. | |

It is certified that error appears in the above-identified patent and that said Letters Patent is hereby corrected as shown below:

On the Title Page, item (60), Related U.S. Application Data, of the printed patent,
"Provisional application No. PCT/JP2012/002487, filed on Apr. 10, 2012" should read
--(60) Continuation of application No. PCT/JP2012/002487, filed on Apr. 10, 2012--.

Signed and Sealed this
Seventeenth Day of February, 2015

Michelle K. Lee
*Deputy Director of the United States Patent and Trademark Office*